United States Patent [19]

Macaione et al.

[11] Patent Number: 4,930,134
[45] Date of Patent: May 29, 1990

[54] PRECISION TEMPERATURE SENSOR

[75] Inventors: Anthony F. Macaione, Missouri City; John V. Wright, Stafford, both of Tex.

[73] Assignee: Reiton Corporation, Houston, Tex.

[21] Appl. No.: 361,364

[22] Filed: Jun. 5, 1989

[51] Int. Cl.$^5$ .............................. H01S 3/00; H01S 3/13
[52] U.S. Cl. ..................................... 372/33; 372/31; 372/34; 372/38
[58] Field of Search ..................... 372/33, 31, 34, 38, 372/50

[56] References Cited

U.S. PATENT DOCUMENTS 4,763,334 8/1988 Shimada et al. ...................... 372/33
4,862,466 8/1989 Eguchi .................................. 372/33

FOREIGN PATENT DOCUMENTS 0176988 10/1979 Japan ...................................... 372/34
0152880 12/1979 Japan ...................................... 372/34
0223180 11/1985 Japan ...................................... 372/33
0016589  1/1986 Japan ...................................... 372/34
0064380  3/1988 Japan ...................................... 372/33

Primary Examiner—William L. Sikes
Assistant Examiner—Georgia Y. Epps
Attorney, Agent, or Firm—Gunn, Lee & Miller

[57] ABSTRACT

A precision temperature sensor is set forth. The sensor is a photosensitive device. Variations in temperature of the light sensitive device cause changes in the voltage across the light sensitive device. The voltage can be measured in microvolts corresponding to fractions of a degree change, and is linear with change in temperature.

15 Claims, 1 Drawing Sheet

PRECISION TEMPERATURE SENSOR

BACKGROUND OF THE DISCLOSURE

The present disclosure is directed to a temperature sensor and more particularly to a solid state temperature sensor which responds to temperature in a sensitive fashion, thereby providing an apparatus yielding output voltage as a function of temperature. The output voltage can be adjusted to a sensitivity where a few microvolts represents a fraction of a degree. Sensitivities as small as 0.001° F. are thought to be obtained with the present apparatus.

Precision temperature measurements typically are obtained with a quartz thermometer or other devices. The accuracy and precision of quartz devices is higher than other types of precision sensors. Useful resolution of 0.001° F. is traceable to the National Bureau of Standards (NBS) and provides sensitive measurements which are relatively stable and repeatable. Such quartz systems however are typically quite expensive. A very popular model is the HP 2804A quartz thermometer, a very popular laboratory standard. Another device which finds acceptance as a precision sensor is the LM34 series provided by National Semiconductor Corporation which utilizes an integrated circuit package in a transistor can or a similar TO92 plastic package. Such devices have a nominal output of 10 MV/° F. and have a published typical accuracy of ±0.4° F. Platinum Resistive Temperature Devices (RTD) have a typical accuracy of ±0.1° F.

Utilizing precision voltage measuring instruments the proposed sensor can be read to output voltages where the least significant digit represents about 0.00076° F. in laboratory conditions, and is thought to be approximately equal to or better than the quartz thermometer mentioned above which exemplifies competitive devices with the temperature sensor disclosed herein.

The present apparatus however is an entirely different type of temperature sensor. It preferably utilizes a silicon planar PIN photodiode. Preferably the photodiode is mounted on a two lead transistor can, and one common size can be as large as a TO-18 package. Another device is the Siemens BPX 65 and representative device is the BPX 66 where the two devices differ only slightly in characteristics which are not significant. There are however even smaller devices. One particularly advantageous PIN photodiode is ordinarily sold as a combination with a laser where the laser and photodiode are mounted on a common base and the photodiode is positioned adjacent to the laser to monitor the backside emission of the laser. One of the features of the present disclosure is the use of a photodiode to provide a controllable laser output beam subject to control of the present apparatus.

Recalling the present disclosure is directed to a temperature sensor, one important use of this sensor is to measure the temperature of the laser source so that the laser performance can be properly controlled. The precise intensity of the light emission from a laser is subject to a number of variables including the laser pumping current. Another variable is laser device temperature. If certain measurements are made using the laser, they cannot be made accurately if the temperature of the laser is subject to drift or variation. It is desirable therefore to know the temperature of the laser so that stabilization of the laser parameters can be normalized with respect to a reference temperature. It is customary to obtain a laser with a monitor PIN photodiode. Ordinarily, that is connected in an optical feedback control loop which modulates the current drive for the laser from the laser power supply. That is well and good; however, it ignores the possibilities of temperature drift, and in particular the possibility that temperature drift may be crucial to the measurement system involving this particular laser. The present disclosure contemplates an alternate and secondary use of the monitor PIN photodiode so that the photodiode is able to measure the temperature of the laser and the surrounding structure for the express purpose of providing an indication of temperature stabilization, or the absence thereof.

The PIN photodiode of the present disclosure thus finds a second use as a temperature sensor. In conjunction with a timing circuit, it is switched out of the back illumination feedback path involving the laser current power supply and is then used in another circuit to provide an input signal indicative of temperature drift. To this end, the photodiode is mounted on a supportive substrate or base. It is normally mounted in common with the laser so that the two are jointly at the same operating temperature. That is, there is no temperature differential between the two of them. Mounting the laser and the PIN photodiode on a common substrate is helpful to provide some measure of output stabilization. The photodiode is connected in a circuit which provides a forward conduction current through the photodiode, this being regulated to a very accurate level, and wherein the regulated current is used to establish a null condition. Then, with temperature variation, the PIN photodiode forms a variation in DC voltage levels which is transferred by means of appropriate operational amplifiers connected as comparators and to otherwise provide nulling of the system, and ultimately forming an output signal. The output signal can be calibrated quite nicely to provide a few microvolts output per 0.001° F., an extraordinary sensitivity for what is in retrospect a relatively simple device.

While the foregoing describes the temperature sensor, it additionally has the second use as mentioned earlier, namely, that the PIN photodiode is installed to respond to illumination periodically and is further arranged to form an easily repeatable temperature measurement. Many objects and advantages in addition to those named above will be observed on a review of the drawings and written specification found below.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
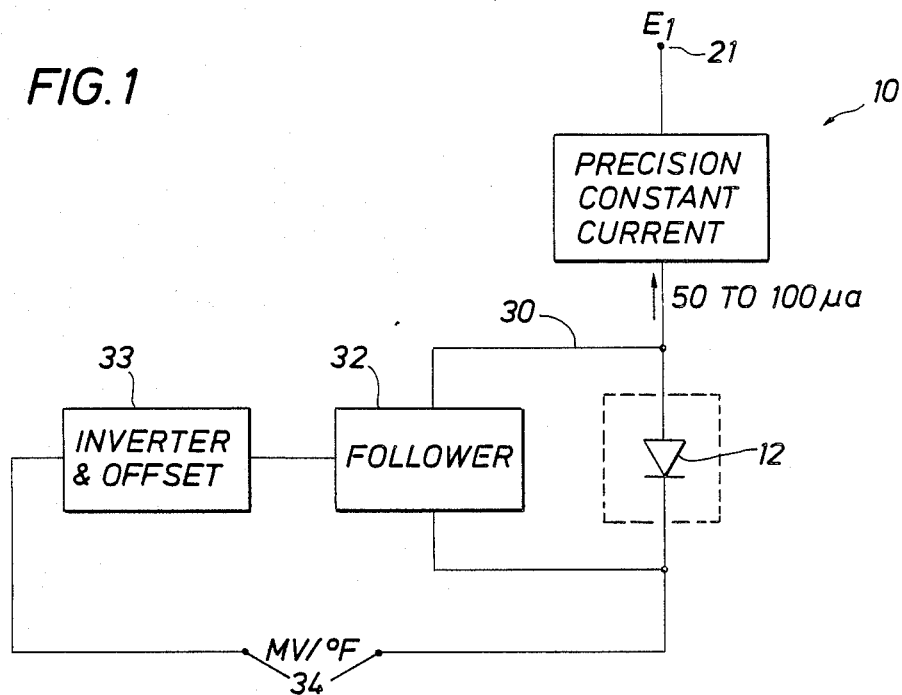
Figure 2:
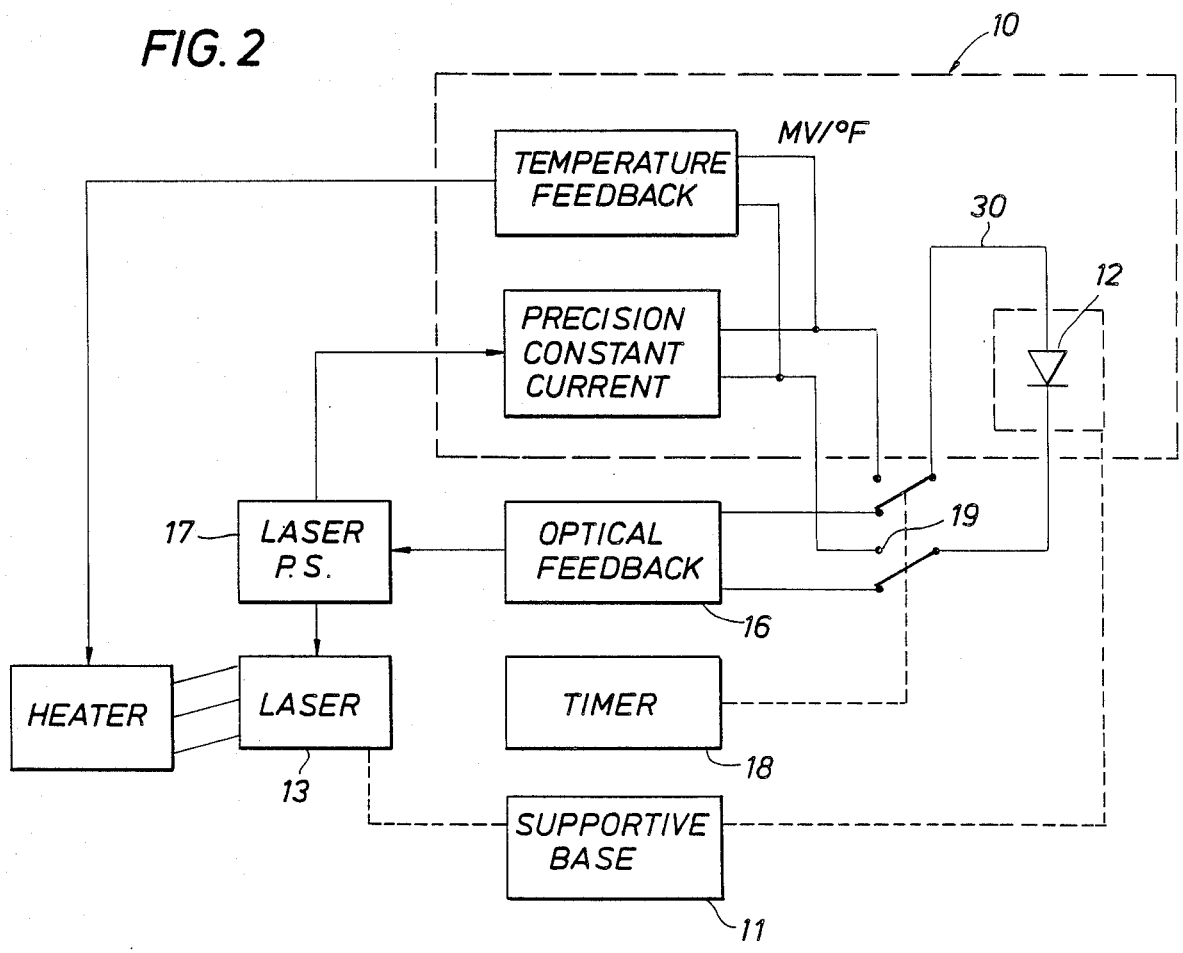

The drawing shown in FIG. 1 is a block diagram of an operating circuit for a PIN photodiode being used only as a temperature sensor; and The drawing shown in FIG. 2 is a block diagram of a temperature sensor system used to control the laser temperature and optically regulate the power output of the laser.

DETAILED DESCRIPTION OF THE PREFERRED EMBODIMENT

Attention is directed first to FIG. 1 of the drawings where the numeral 10 identifies the temperature system of the present disclosure. In FIG. 2, it is described in conjunction with a laser control system which incorporates a laser and a PIN photodiode (all to be described below). In general, however, the laser system will be described as the controlled laser system, and especially a control laser system utilizing the same PIN photodiode in an optical feedback control system for controlling current from the laser power supply. The physical context in which the present apparatus is installed should be considered first. The numeral 11 identifies a supportive base. A PIN photodiode 12 is supported on the base 11 and this support has been indicated by the dotted line connection shown in the drawing. Equally, the supportive base 11 likewise supports the laser 13. The laser is typically constructed so that it emits light out of both ends. The diode 12 is positioned so that it is illuminated by emission from the backside of the laser. This is, the laser emits a principal beam from one end but the back beam from the opposite end illuminates the diode. The two are mounted in close proximity so that the spacing is several hundred microns between the diode and the laser on the common base 11.

The supportive base 11 holds the two optical components in fixed close proximity to one another, and they are ordinarily shielded so that extraneous light does not impinge on them. This permits establishment of a feedback circuit. The diode 12 is thus positioned to permit laser light to impinge thereon to achieve the photodiode effect well known for the diode 12. Moreover, the photodiode 12 is connected with an optical feedback control circuit 16 to control the laser power supply 17 to thereby control the light intensity. This feedback loop assists in stabilization of laser beam intensity.

The laser 13 however is sensitive to temperature. It is subject to drift as a function of temperature. The same is true of the PIN photodiode 12. It also is subject to drift. The photodiode 12 is thus mounted on the supportive base 11 and follows the temperature thereof. Normally, it is attached by some type of adhesive which secures the housing of the diode 12 and the laser to the supportive base 11. A timer circuit 18 operating a switch 19 controls the connection of the photodiode 12. Obviously, if the laser is off, the optical feedback loop involving the control 16 and the power supply 17 is not operative. At this interval, the timer switches so that the switch 19 connects the diode 12 into the temperature circuit 10. Accordingly, temperature measurements can be made at that instant. Later, the timer 18 can be switched to connect the PIN photodiode in the temperature sensor circuit 10 for measurement.

In the circuit 10 (FIG. 1) the aspect of the PIN photodiode which comes into play is the intrinsic region width and in particular, its operation with a forward bias applied. A voltage source is illustrated at 21, and provides current to the diode. The current flow is highly regulated so that the net current flowing through the diode 12 is in the range of a few hundred microamperes, typically about 50–100 microamperes. Current is regulated and stabilized through the use of precision components. The voltage across the diode 12 is output on a conductor 30.

The conductor 30 is input to a follower amplifier 32. The small signal variations across the diode 12 as a result of small voltage changes in the diode 12 form a signal for the follower amplifier 32. The output of the amplifier 32 is then provided to another amplifier 33 which forms the output signal across a pair of terminals at 34. The terminals 34 provide a voltage which is proportional for temperature as will be described. Moreover, it can be zeroed to a particular point so that temperature increase above that level is then measured as a positive voltage.

Operation of the temperature sensor 10 should be considered. Assume that the timer 18 switches the photodiode 12 into the sensor circuit 10. As the temperature of the supportive base 11 changes, such changes are imparted to the diode 12. The voltage at the anode of the diode 12 is observed at the conductor 30 and is input into the follower amplifier 32, so that the output is varied. The system shown is relatively sensitive; it is sensitive to the point of providing a microvolt swing at the terminals 34 for a change of just 0.001° F. Scale values can be altered. As an example, this voltage is obtained at the minimum temperature which is anticipated in a given situation. As the temperature increases above that level, a positive output voltage is observed at the terminals 34 which is precisely proportionate to the incremental change in temperature. Utilizing a precision measuring instrument capable of measuring to the microvolt level, the output voltage can be quickly measured and converted into incremental temperature change at the accuracy mentioned.

The present temperature sensor 10 has a settle time of just a few nanoseconds. Thus, the timer 18 can switch often without any difficulty. Generally, it is desirable to measure the temperature first and thereafter to switch the diode 12 out of the sensor circuit 10 into the optical feedback connection for control of the power supply for the laser. By this procedure, the laser can be operated instantly after having obtained a precise and accurate measurement of laser temperature. This is particularly successful in the situation where the diode 12 and laser 13 are packaged in a common package and are adhesively or otherwise attached to the supportive base 11. One use of the temperature measurement circuit of FIG. 1 is shown in FIG. 2 where the output from the terminals 34 is applied to a heater for stabilizing the laser 13 at a selected temperature. Typically, this involves heating to a specified level at the base 11 and the laser 13 will follow the base temperature.

While the foregoing is directed to the preferred embodiment, the scope thereof is determined by the claims which follow:

What is claimed is:

1. A laser control system comprising:
   (a) a laser emitting a light beam therefrom capable of illumination;
   (b) a photodiode exposed to the laser in near proximity thereto for receiving illumination thereof;
   (c) an optical feedback control means connected to said photodiode for providing a control signal for a laser power supply wherein the laser power supply provides controlled power for operation of said laser; and
   (d) means for selectively switching the photodiode into connection with said control means for operation of said laser subject to control as measured by said photodiode, and wherein said photodiode and said laser are supported for exposure to a common temperature.

2. The apparatus of claim 1 wherein said laser and photodiode are positioned in operative proximity to establish laser light coupling therebetween and further wherein said photodiode has a pair of terminals, said terminals being connected with a switch means enabling said photodiode to be connected to said control means.

3. The apparatus of claim 2 including timer means for periodically operating said switch means to connect said photodiode to said control means.

4. The apparatus of claim 1 wherein said photodiode is photon responsive.

5. The apparatus of claim 1 wherein said photodiode is a PIN photodiode having a light admitting means exposed to the laser light beam.

6. The apparatus of claim 1 wherein said photodiode is connected in a forward bias direction.

7. The apparatus of claim 1 wherein said switch means alternately connects said photodiode to temperature measuring means having a circuit connection with said photodiode through said switch means and wherein the output of said measuring means is a signal proportionate to temperature of said photodiode.

8. The apparatus of claim 7 wherein said measuring means is connected to said diode by said switch means under control of a timer means.

9. The apparatus of claim 8 wherein said timer means first connects said diode to said measuring means and then to said control means.

10. A temperature sensor comprising:
(a) a PIN diode having a pair of terminals;
(b) bias current establishing means connected to said diode for providing a current flow in the forward direction though said diode at a regulated and specified level wherein the current level establishes a forward drop across said diode;
(c) voltage differential measuring means for measuring changes in voltage across said diode and forming an output signal of such changes; and
(d) means for positioning said diode for exposure to a temperature to be measured wherein said diode follows the temperature.

11. The apparatus of claim 10 wherein said diode includes an intrinsic region having a specified width wherein the voltage across the terminals of said diode is linear between first and second temperatures as a function of temperature.

12. The apparatus of claim 11 wherein said bias current means for said diode includes a constant current source in series with said diode wherein current flows in the forward direction across said diode; wherein the voltage across said diode decreases with temperature.

13. The circuit of claim 10 including cascaded, multiple stage, serially connected amplifiers wherein one of said amplifiers includes positive and negative terminals.

14. The apparatus of claim 13 including an output DC amplifier connected serially in said amplifiers.

15. The apparatus of claim 10 wherein said positioning means includes means attaching said diode to a support, and also includes a housing for said diode.

* * * * *